US007390192B2

(12) United States Patent  
Graetz

(10) Patent No.: US 7,390,192 B2  
(45) Date of Patent: Jun. 24, 2008

(54) SYSTEM AND METHOD FOR DISTRIBUTING POWER IN AN ELECTRONIC SYSTEM

(75) Inventor: Ernest F. J. Graetz, Largo, FL (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 11/461,504

(22) Filed: Aug. 1, 2006

(65) Prior Publication Data

US 2008/0032518 A1    Feb. 7, 2008

(51) Int. Cl.
*H05K 7/20* (2006.01)
(52) U.S. Cl. .......................................... 439/61; 361/775
(58) Field of Classification Search ............... 439/61, 439/64, 108; 361/799, 108, 888, 794, 775
See application file for complete search history.

(56) References Cited

U.S. PATENT DOCUMENTS 3,368,117 A * 2/1968 Pond et al. ................. 361/801
4,164,362 A * 8/1979 Cobaugh et al. .............. 439/64
4,241,381 A * 12/1980 Cobaugh et al. ............ 361/785
4,398,780 A * 8/1983 Novotny et al. ............. 439/284
4,574,332 A * 3/1986 Calabro ..................... 361/791
4,609,829 A * 9/1986 Milby et al. ................. 307/150
4,755,145 A * 7/1988 Johnson et al. ............... 439/61
4,846,699 A * 7/1989 Glover et al. ................ 439/64
4,883,427 A * 11/1989 Kohl et al. ................... 439/64
5,053,920 A * 10/1991 Staffiere et al. ............. 361/694
5,618,197 A * 4/1997 Bodahl-Johnsen .......... 439/260
6,879,489 B2 * 4/2005 Koertzen .................... 361/704

* cited by examiner

Primary Examiner—Neil Abrams
(74) Attorney, Agent, or Firm—McDonnell Boehnen Hulbert & Berghoff LLP

(57) ABSTRACT

An electronic system comprises a system board, one or more cards adapted to couple to the system board, wherein the system board transfers signals to and from the one or more cards, at least one electrically conductive plate, and one or more connectors coupled to the at least one electrically conductive plate to or from the one or more cards. A plurality of power supplies and voltages may be used. A measurement point on the at least one electrically conductive plate may be used to exert additional control over the plurality of power supplies.

20 Claims, 2 Drawing Sheets

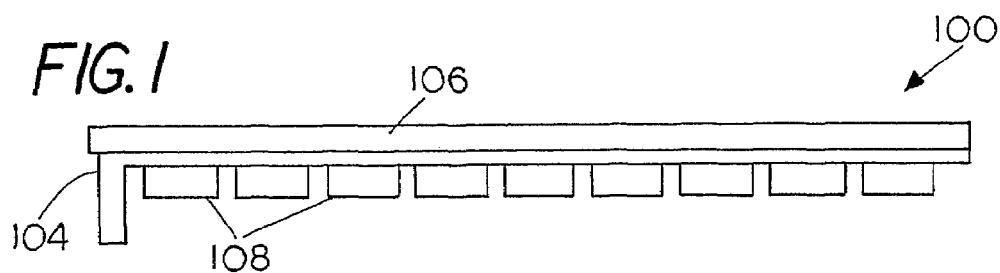
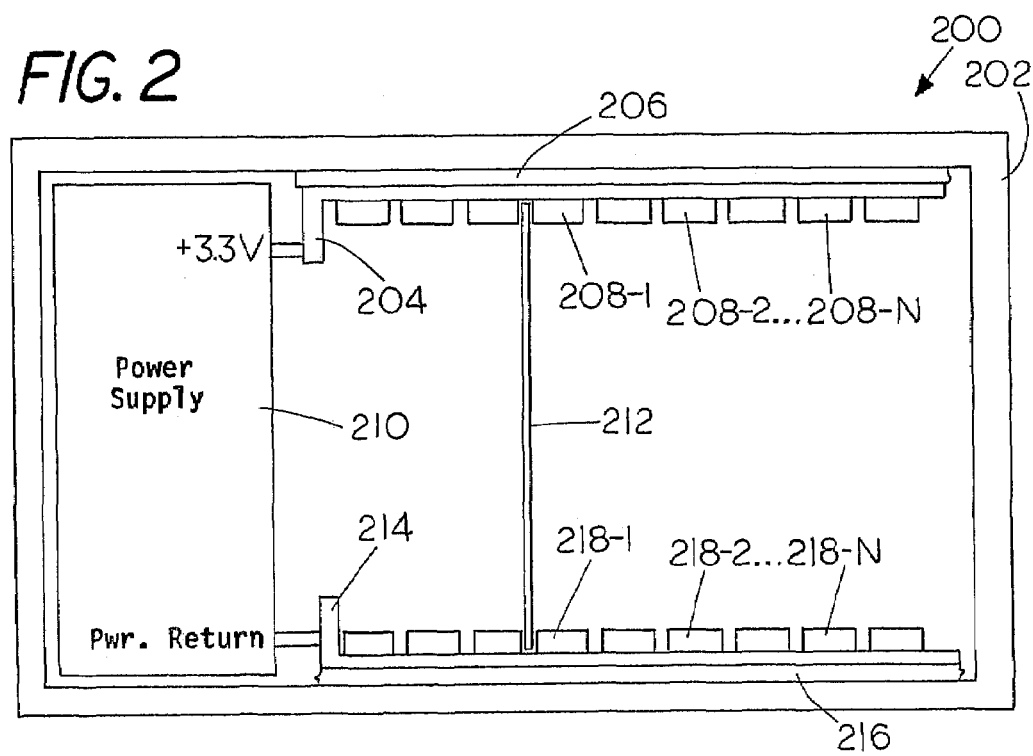
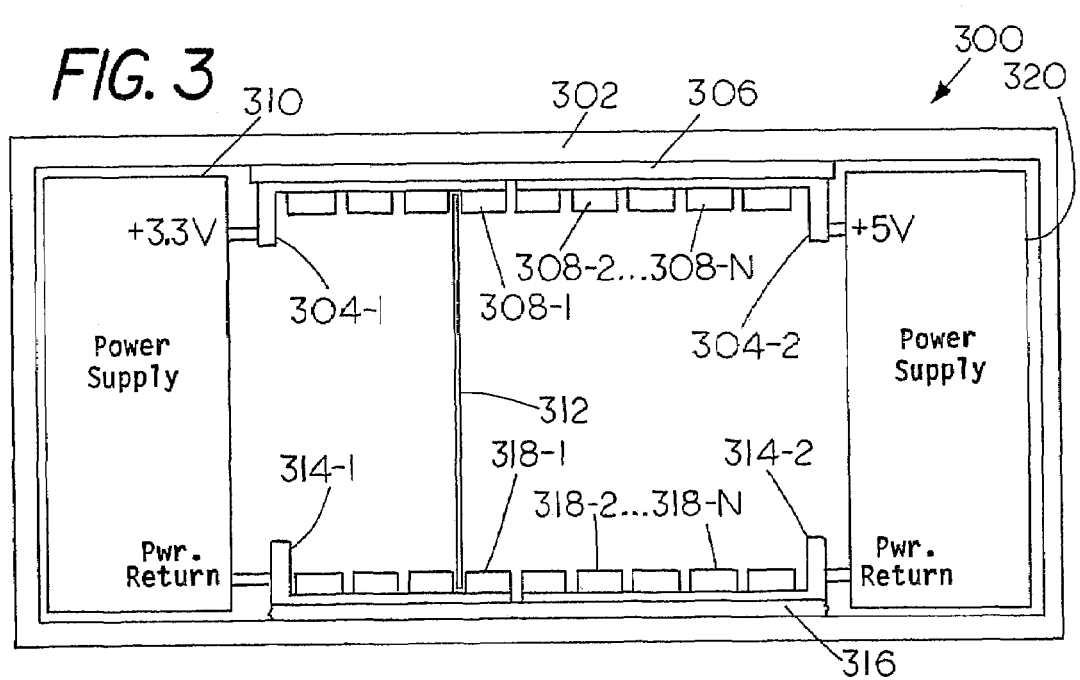

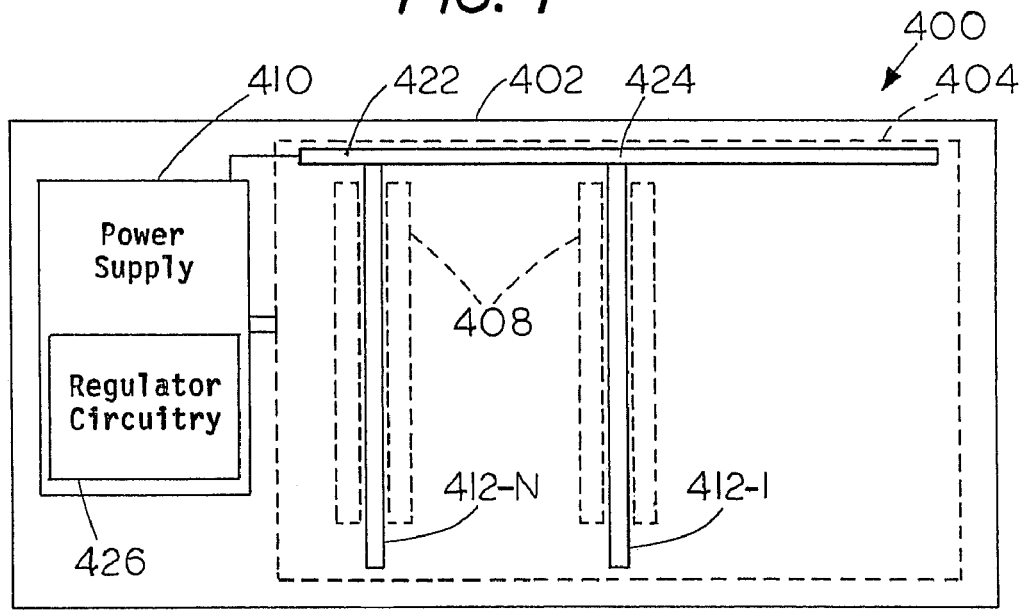
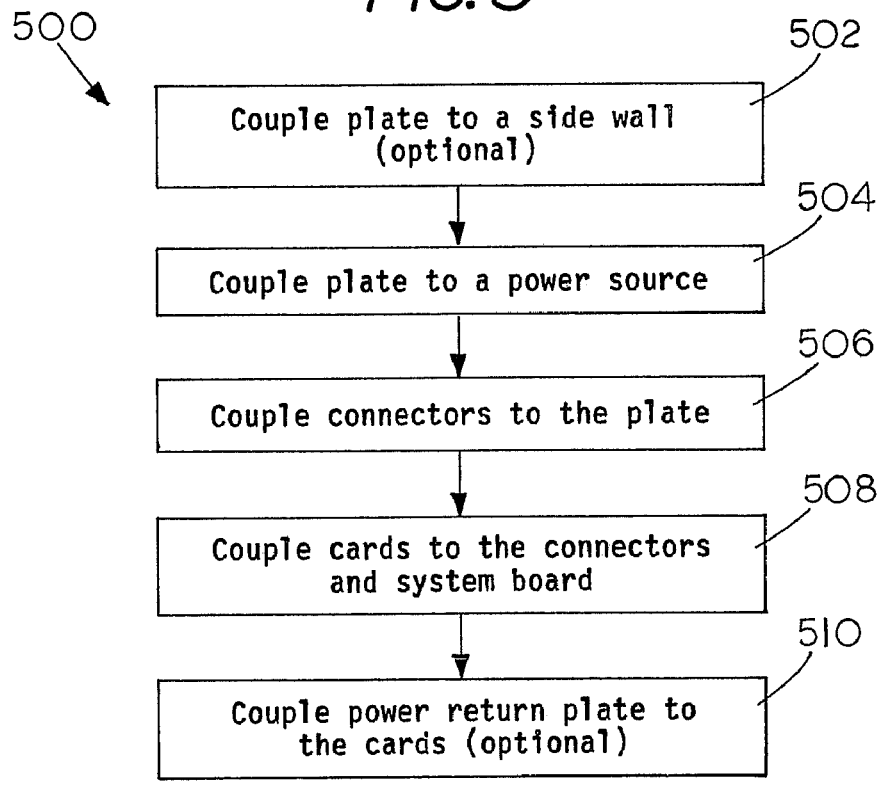

SYSTEM AND METHOD FOR DISTRIBUTING POWER IN AN ELECTRONIC SYSTEM

BACKGROUND

In distributing power in an electronic system, such as a shelf with plug-in cards, it is often necessary or desirable to control the voltage distribution to within specific tolerances throughout the system. For example, it might be necessary in some circumstances to distribute the voltage with a ±1% tolerance. This means that the voltage at a given point in the system should be within ±1% of the desired voltage. There are various reasons for requiring these tolerances such as power requirements of individual cards.

In systems with plug-in cards this degree of control is often obtained by placing regulator circuits on each card. The regulators are able to control the voltage to within the desired degree of accuracy. However, reproducing the circuitry for multiple cards is more expensive than using a single converter. In addition, reproducing the multiple circuits takes up extra space on the cards and in the shelf.

One method of regulating the voltage without placing regulator circuits on each card is to use power and ground planes in the motherboard to which the cards are attached. However, the motherboard contains many pin holes or vias to couple to and transfer signals between the cards. Connectors for power and ground either require the addition of more vias or the use of vias already on the card. This creates a number of problems. First, space on the motherboard is often limited. The use of vias for power and ground further limits the vias available for signal transfer. Second, the many vias in the motherboard increases the resistance in the motherboard. This increase in resistance creates problems with excess voltage drops. It, therefore, becomes difficult to regulate the voltage to within the needed tolerances. Third, the conductor layer thickness is limited in the motherboard for practical reasons. The limited thickness also increases the resistance in the motherboard.

For the reasons stated above, and for other reasons stated below which will become apparent to those skilled in the art upon reading and understanding the present specification, there is a need in the art for a more efficient system of distributing power.

SUMMARY

The above-mentioned problems and other problems are resolved by the present invention and will be understood by reading and studying the following specification.

In one embodiment, an electronic system is provided. The electronic system comprises a system board, one or more cards adapted to couple to the system board, wherein the system board transfers signals to and from the one or more cards, at least one electrically conductive plate, and one or more connectors coupled to the at least one electrically conductive plate and adapted to conduct electricity from the at least one electrically conductive plate to or from the one or more cards.

DRAWINGS

The present invention can be more easily understood and further advantages and uses thereof more readily apparent, when considered in view of the description of the following figures in which:

FIG. 1 shows an edge view of a power distribution device according to one embodiment of the present invention.

FIG. 2 is a top view of an electronic system distributing power according to one embodiment of the present invention.

FIG. 3 is a top view of an electronic system distributing power according to another embodiment of the present invention.

FIG. 4 is a side view of an electronic system distributing power according to another embodiment of the present invention.

FIG. 5 is a flow chart of assembling an electronic system for distributing power according to one embodiment of the present invention.

Like reference numbers and designations in the various drawings indicate like elements.

DETAILED DESCRIPTION

In the following detailed description, reference is made to the accompanying drawings that form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the scope of the present invention. It should be understood that the exemplary method illustrated may include additional or fewer steps or may be performed in the context of a larger processing scheme. Furthermore, the method presented in the drawing figures or the specification is not to be construed as limiting the order in which the individual steps may be performed. The following detailed description is, therefore, not to be taken in a limiting sense.

Embodiments of the present invention enable easier distribution of power within certain tolerance by distributing power through at least one plate which has low resistance compared to other power distribution devices, such as a motherboard. By doing so, the voltage level on the at least one plane can be controlled from a single point rather than through regulators on each board. Also, embodiments of the present invention avoid the difficulty of distributing power through the motherboard and the relatively high resistance and voltage drops due to the large numbers of vias in the motherboard. In addition, embodiments of the present invention help address heat transfer by providing thermally conductive insulators in contact with the at least one power plate.

Note: The terms motherboard, mainboard, and system board are used interchangeably in the following description. Also, the terms cards, boards, and plug-in cards are used interchangeably in the following description.

FIG. 1 shows a power distribution device 100 according to one embodiment of the present invention. Power distribution device 100 includes insulator 106, at least one electrically conductive plate 104, and at least one connector 108. Plate 104 is a substantially solid conductive sheet. Plate 104, in various embodiments, has holes and/or cut outs to attach plate 104 to other components such as connectors 108 and insulator 106. However, these holes and cut outs are typically filled with conductive materials, i.e. metal screws, conductive connectors 108, etc. Therefore, the resistance across plate 104 is minimally affected by any such holes and cut outs. In addition, since plate 104 is not a motherboard, it lacks the many vias with their associated pin clearance areas found on a motherboard for data signal transfer which would decrease the resistance across plate 104. Hence, plate 104 is substantially solid.

Plate 104 is electrically conductive. In particular, in this example, plate 104 is comprised of aluminum made electrically conductive through one of various processes. Such processes include, but are not limited to, electroplating, and passivation such as class 3 chromate conversion. In addition, it is to be understood that, in other embodiments, other electrically conductive base materials and/or processes are used. Also, in this example, plate 104 is a flat rectangular shape, but embodiments of the present invention are not intended to be so limited. For example, in other embodiments, plate 104 is circular, concave, and/or irregular shape with hole or cutouts. Plate 104 is adapted to couple to a power source to provide power to an electronic system.

Plate 104 is coupled to insulator 106 in this example. Insulator 106 is adapted to electrically separate plate 104 from other conductive materials which might electrically short plate 104, such as a metal chassis. However, it is to be understood that, in other embodiments, insulator 106 is not used. For example, in some embodiments, plate 104 is a chassis wall and insulator 106 is not needed. Insulator 106 is further adapted, in this example, to be thermally conductive. For example, insulator 106 is made of a thermal chromeric pad in this example. Alternatively, insulator 106 is made of fiberglass laminate, polyester film (such as Mylar™), and the like. In addition, in other embodiments, insulator 106 is only adapted to be electrically non-conductive.

Plate 104 is also coupled to at least one connector 108. Connectors 108, in this example, are aluminum wedge clamps which have been processed to enable electrical conductivity. Such processing includes, but is not limited to, electroplating the aluminum, and passivating the aluminum such as through class 3 chromate conversion. Also, in other embodiments, other types of connectors are used, such as screws, sockets, etc. Connectors 108 are adapted to couple to one or more printed circuit boards in an electronic system. Power on plate 104 is therefore, passed to the one or more printed circuit boards through connectors 108. Hence, power distribution device 100 is used in various electronic systems to improve power distribution. Since plate 104 substantially lacks vias or holes, the low resistance of plate 104 helps deal with problems of excess voltage drop. The low resistance of plate 104 can be further enhanced by increasing the average thickness of plate 104 beyond typical limits of motherboard thickness. In addition, by distributing power via plate 104, pins and connectors on a motherboard are made available for other uses, such as data signals. An exemplary system distributing power using power distribution device 100 is described below.

FIG. 2 is a top view of an electronic system 200 distributing power according to one embodiment of the present invention. Chassis 202 of system 200 is adapted to house other components of system 100. For example, power supply 210 and plate 204 are housed by chassis 202. Chassis 202 is made of any appropriate material for a chassis or housing. For example, in this embodiment, chassis 202 is made of aluminum. Alternatively, in other embodiments, chassis 202 is made of other metals, metal alloys, hard polymers, and the like. In embodiments where chassis 202 is not electrically conductive, insulators 206 and 216 can be omitted.

Plate 204 is an electrically conductive plate, such as plate 104 in FIG. 1, coupled to power supply 210. In this example, plate 204 is silver electroplated aluminum. However, in other embodiments, other base materials other than aluminum can be used. In addition, in other embodiments using electroplating, other materials, such as solder plate, can be used to electroplate plate 204. Furthermore, in other embodiments, plate 204 is passivated, such as through class 3 chromate conversion, rather than electroplating to enable the electrical conductivity of plate 204. Plate 204 substantially lacks hole or vias. The lack of vias reduces the electrical resistance of plate 204 and hence, reduces the voltage drop across plate 204. Some holes may be present in plate 204, such as screw holes, etc. However, many of these holes are filled with electrically conductive material such as screws. In addition, there are relatively few holes when compared to a motherboard or master interconnect board.

Plate 204 is also coupled to chassis 202 via insulator 206 in this example. However, as mentioned above, in embodiments with an electrically non-conductive chassis 202, insulator 206 can be omitted. As shown in FIG. 2, insulator 206, in this example, is a thin sheet insulator which substantially covers the surface area between plate 204 and chassis 202. In this embodiment, insulator 206 is made of a thermal chromeric pad. However, it is to be understood that in other embodiments other insulating materials are used, such as fiberglass laminates, polyester films, non-conductive epoxy and the like. In addition to electrically insulating plate 204 from chassis 202, insulator 206, in this embodiment, provides thermal conductivity to conduct heat away from plate 204. Alternatively, in embodiments with an electrically non-conductive chassis 202, insulator 206 is not used and plate 204 also acts as a heat spreader maximizing heat transfer out of an electrically non-conductive chassis 202.

In other embodiments, the insulating material used for insulator 206 is not a good thermal conductor and is used primarily for electrically insulating plate 204 from chassis 202. Furthermore, although insulator 206 substantially covers the surface area between plate 204 and chassis 202 in this example, it is to be understood that in other embodiments, insulator 206 is selectively placed between chassis 202 and plate 204 without substantially covering the surface area. For example, in one embodiment, insulator 206 is comprised of a plurality of insulating pads which are placed to create a gap between chassis 202 and plate 204.

Also coupled to plate 204 are connectors 208-1 ... 208-N, where N is the total number of connectors. Connectors 208-1 ... 208-N are adapted to couple to one or more boards 212 (also referred to herein as cards or plug-in cards). Board 212 is a printed circuit board which adds functionality to system 200. Connectors 208-1 ... 208-N make electrical contact with board 212 along a surface edge of boards 212. In this embodiment, connectors 208-1 ... 208-N are electroplated to enable the electrical conductivity of connectors 208-1 ... 208-N. In addition, connectors 208-1 ... 208-N are passivated, in some embodiments, such as through electrically conductive chromate conversion. Passivation reduces corrosion and enables conductivity of connectors 208-1 ... 208-N. In this embodiment, connectors 208-1 ... 208-N are wedge clamps which extend along a length of an edge of boards 212. When tightened, wedge clamps pull closer together securing board 212 tightly in system 200. Hence wedge clamps provide electrical, thermal, and mechanical contact with boards 212. Although wedge clamps are used in this example, it is to be understood that in other embodiments, other connectors are used to provide electrical and/or mechanical contact with boards 212. For example, screws are used in some embodiments to couple boards 212 to connectors 208-1 ... 208-N. The screws can be passivated or electroplated to enable electrical conductivity of the screws thereby providing an electrical connection as well. Furthermore, in other embodiments, connectors 208-1 ... 208-N provide electrical connection but not mechanical connection as well.

In addition, in this example, system 200 includes plate 214, insulator 216 and connectors 218-1 ... 218-N on the side opposite plate 204, insulator 206 and connectors 208-1 ...

208-N. Plate 214, in this example functions as a power return path to provide a single point ground in system 200. Plate 214, insulator 216 and connectors 218-1 . . . 218-N are similar to plate 204, insulator 206 and connectors 208-1 . . . 208-N, respectively, as discussed above. Since plates 204 and 214, in this example, are insulated from the outer walls of chassis 202, the power and return are isolated from chassis 202. In addition, since plates 204 and 214 are parallel with and make large areas of contact through insulators 206 and 216, low thermal resistance can be achieved. Plate 214 helps minimize voltage drops for the power return. Also, plate 214 is coupled in parallel with a motherboard (not shown) in system 200 for a common signal return and back plane for controlled impedance signal paths in some embodiments.

Additionally, good thermal paths from the active circuitry on boards 212 to connectors 208-1 . . . 208-N and 218-1 . . . 218-N, and consequently plates 204 and 214, are formed because power and return planes on boards 212 make direct contact to all of the active circuitry and connectors 208-1 . . . 208-N and 218-1 . . . 218-N. Consequently, lower thermal impedance can be achieved from the active circuitry to edges of boards 212 without extra thermal planes or thermal vias in boards 212.

In operation, a current from power source 210 is provided to plate 204. Plate 204 conducts the electrical current throughout plate 204 and to connectors 208-1 . . . 208-N. Since plate 204 substantially lacks vias or holes, the resistance across plate 204 is low. For each board 212 coupled to connectors 208-1 . . . 208-N, current is drawn from plate 204. Current drawn for each board 212 is passed through connectors 218-1 . . . 218-N to plate 214 from which the current is returned to power supply 210, providing a single point ground for system 200. Insulators 206 and 216, in this example, also provide thermal conductivity to conduct heat from plates 204 and 214. In addition, although not necessary, a voltage sense point is placed, in some embodiments, at a location on plate 204 corresponding to about half the total voltage drop across plate 204 to increase control over the low voltage drop. An exemplary embodiment using a voltage sense point is described in more detail below with regards to FIG. 4.

FIG. 3 is a top view of another configuration of an electronic system 300 distributing power according to one embodiment of the present invention. For this example embodiment, system 300 includes chassis 302, insulators 306 and 316, power source 310, and connectors 308-1 . . . 308-N and 318-1 . . . 318-N. Each of these elements shown in FIG. 3 functions as described above with respect to like numbered elements shown in FIG. 2. In addition, system 300 includes power source 320, and plates 304-1, 304-2, 314-1, and 314-2. In this example, power source 320 outputs a different level power than power source 310. For example, in one embodiment, power source 310 outputs +3.3 volts and power source 320 outputs +5 volts. However, it is to be understood that in other embodiments, other power levels are used.

In this example, plates 304-1 and 314-1 are coupled to power source 310 while plates 304-2 and 314-2 are coupled to power source 320. In operation, current is transferred from power source 310 to plate 304-1 and from power source 320 to plate 304-2. The current passes from each of plates 304-1 and 304-2 to the connectors 308-1 . . . 308-N coupled respectively to one of plates 304-1 and 304-2. From connectors 308-1 . . . 308-N, the current passes to boards 312. The current then passes from boards 312 to connectors 318-1 . . . 318-N. Plates 314-1 and 314-2 are power return plates and conduct the current from connectors 318-1 . . . 318-N back to power sources 310 and 320 respectively. In some embodiments, plates 314-1 and 314-2 comprise a single return plate rather than two separate plates enabling a single point ground via the low impedance path of plates 314-1 and 314-2. Insulators 306 and 316 insulate plates 304-1, 304-2, 314-1, and 314-2 from chassis 302.

This exemplary configuration in FIG. 3 provides two separate power levels for system 300. It is to be understood that, in other embodiments, other configurations are used to provide two or more separate power levels. For example, in one embodiment, only one power source is used. The power source is connected to two or more plates via resistors to provide different voltages to each plate based on the value of the resistors. In another alternative configuration, each of two or more plates are used for delivering different power levels and a motherboard to which are attached boards is used for the power return to ground. It is to be understood that any suitable configuration adapted to provide different power levels can be used in embodiments of the present invention.

FIG. 4 is a side view of an electronic system distributing power according to another embodiment of the present invention. Embodiments of the present invention enable sufficiently low voltage drops that additional control of the voltage drop is not used in some embodiments. However, in the example in FIG. 4, additional control of the voltage across plate 404 is achieved by placing a voltage sense point at a location 424 on plate 404 corresponding to about half the total voltage drop across plate 404. Board 412-2 is placed approximately at voltage sense point 424. Board 412-1 is adapted, in this example, to measure the voltage at voltage sense point 424. However, in other embodiments, a separate sensor is used to measure the voltage.

Boards 412-1 . . . 412-N, where N is the total number of boards, are coupled to plate 404 via connectors 408. In this embodiment, connectors 408 are wedge clamps which extend along a length of each of boards 412-1 . . . 412-N. In addition, boards 412-1 . . . 412-N are coupled to motherboard 422. Motherboard 422 transfers signals between boards 412-1 . . . 412-N. In addition, mother 422 is coupled to power supply 410. Board 412-1 passes to motherboard 422 the value of the measured voltage on plate 404 at voltage sense point 424. Motherboard 422 then passes the value to power supply 410. In this embodiment, power supply 410 is adapted with regulator circuitry 426. Regulator circuitry 426 is adapted to control the output voltage of power supply 410 based on the value of the voltage measured at voltage sense point 424 received from motherboard 422. In this way, greater control of the voltage drop is achieved.

For example, assuming plate 404 is ⅛ inch thick, 8 inches high and 10 inches long, plate 404 has a cross sectional area of 1 inch. Although end-to-end resistance across 404 will vary with the material used, an electroplated aluminum plate of the mentioned dimensions has an end-to-end resistance of about 0.000011 ohms. At 300 amps, the voltage drop across plate 404 is approximately 3.3 mV which is only 0.1% of a 3.3 V power supply. Current decreases along plate 404 as each of boards 412-1 . . . 412-N draws current. Assuming equal power distribution for boards 412-1 . . . 412-N and placing a voltage sense point 424 at half the voltage drop along plate 404 (i.e. where the voltage drops about 0.025% of the 3.3 V power supply), regulator circuitry 426 can adjust the voltage output of power supply 410 to maintain the voltage within 0.025% of the 3.3 V along plate 404 under these exemplary conditions.

FIG. 5 is a flow chart showing a method 500 of assembling an electronic system for distributing power according to one embodiment of the present invention. At 502, at least one electrically conductive plate (such as plate 104 in FIG. 1) is optionally coupled to a chassis wall (such as chassis 202 in FIG. 2). In some embodiments, a chassis side wall can be used as an electrically conductive plate to conduct power to one or more cards. In other embodiments, the electrically conductive plate is coupled to a chassis side wall via an insulator (such as insulator 106 in FIG. 1). In some embodiments, insulator 106 is an electrically insulating epoxy which may adhere to both the conductive plate and to the chassis wall. In other embodiments, coupling the conductive plate to a chassis wall includes coupling a sheet insulator, such as fiberglass laminate, to the chassis wall and then coupling the plate to the insulator. The conductive plate substantially lacks connector pin clearance holes associated with vias, and cut outs, etc. The lack of these holes, vias, etc. reduces the electrical resistance across the plate. In addition, in some embodiments, two or more electrically conductive plates are used for delivering different power levels in the system.

At 504, the electrically conductive plate is coupled to a power source. At 506, connectors (such as connectors 108 in FIG. 1) are coupled to the conductive plate. At 508, one or more cards (such as boards 212 in FIG. 2) are coupled to the connectors and to a system board. The connectors are adapted to conduct current from the electrically conductive plate to the one or more cards.

By conducting current from a power source to the boards via the plate and connectors rather than through the system board, pins and other connectors on a system board that would otherwise be used for power and return are available for other uses such as transferring signals. The voltage drop can also be regulated to a high degree of accuracy without the need for multiple regulators. This is accomplished at least in part, by providing the power to boards via a plate which has relatively low resistance making it easier to control voltage drops.

For example, in some embodiments, coupling the plate to a power source includes placing a voltage sense point on the plate and passing the value of the measured voltage back to the power supply to adjust the voltage output, as described above with regards to FIG. 4. The voltage sense point in some such embodiments is a location on the plate corresponding to about half the voltage drop across the plate. In addition, the insulator is adapted in some embodiments to be thermally conductive. In such embodiments, heat transfer is also enabled. Finally, the conductive plate can also serve as a structural element in the electronic system by being coupled to a chassis wall via the insulator to reinforce the wall.

At 510, an electrically conductive return plate (see plate 214 in FIG. 2) is optionally coupled to the one or more cards. In some embodiments, a chassis wall is used as a return plate. In other embodiments, a separate return plate is coupled to a chassis wall via an insulator. The return plate can be used to provide a single point ground. In some embodiments, this power return plate is not used. For example, in some embodiments, the system motherboard is used for power return.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. An electronic system comprising:
    a system board;
    one or more cards adapted to couple to the system board, wherein the system board transfers signals to and from the one or more cards;
    at least one electrically conductive plate;
    one or more connectors coupled from the at least one electrically conductive plate to or from the one or more cards; and
    a power source coupled to the at least one electrically conductive plate, wherein the power source is adapted to regulate the voltage output based on a measured voltage at a point on the at least one electrically conductive plate.

2. The electronic system of claim 1, wherein the alt least one electrically conductive plate is substantially solid.

3. The electronic system of claim 1, wherein the one or more connectors further comprise wedge clamps.

4. The electronic system of claim 1, wherein the at least one electrically conductive plate further comprises two substantially solid electrically conductive plates, each electrically conductive plate being used to distribute a different power level to the one or more cards, wherein the two electrically conductive plates are isolated electrically from each other.

5. The electronic system of claim 1, wherein the at least one electrically conductive plate is comprised of one of electroplated aluminum and passivated aluminum using class 3 chromate conversion.

6. The electronic system of claim 1, wherein the measured voltage is measured at a point on the at least one electrically conductive plate corresponding to about half the voltage drop across the at least one electrically conductive plate.

7. The electronic system of claim 1, further comprising a power return plate coupled to the one or more cards.

8. The electronic system of claim 1, further comprising:
    a chassis; and
    an insulator adapted to couple the at least one electrically conductive plate to a side of the chassis, wherein the insulator inhibits electrical contact between the chassis side and the at least one electrically conductive plate.

9. The electronic system of claim 8, wherein the insulator is comprised of one of a fiberglass laminate, a polyester film, and a thermal chromeric pad.

10. A power distribution device comprising:
    at least one electrically conductive plate adapted to couple to a power source; and
    at least one connector coupled to the at least one electrically conductive plate and adapted to conduct electricity from the at least one electrically conductive plate to one or more printed circuit boards coupled to a system board wherein the power source is adapted to regulate the voltage output based on a measured voltage at a point on the at least one electrically conductive plate.

11. The power distribution device of claim 10, wherein the at least one electrically conductive plate is substantially solid.

12. The power distribution device of claim 10, wherein the at least one electrically conductive plate is one of a circular plate, a rectangular plate, and an irregular shaped plate having cut outs.

13. The power distribution device of claim 10, further comprising:
    an insulator coupled to the at least one electrically conductive plate to insulate the at least one electrically conductive plate such that other electrically conductive materials do not short the at least one electrically conductive plate.

14. The power distribution device of claim 13, wherein the insulator is comprised of one of a fiberglass laminate, a polyester film, and a thermal chromeric pad.

15. A method of assembling an electronic system, the method comprising:
    coupling a least one electrically conductive plate to a power source;

coupling one or more connectors to the at least one electrically conductive plate; and coupling one or more cards to the one or more connectors and a system board, wherein power is connected to the one or more cards via the at least one or more electrically conductive plate and one or more connectors, and wherein the power source is adapted to regulate the voltage output based on a measured voltage at a point on the at least one electrically conductive plate.

16. The method of claim 15, further comprising:

coupling the at least one electrically conductive plate to a chassis side wall with an electrically insulating epoxy.

17. The method of claim 15, further comprising:

coupling a sheet insulator to a chassis wall; and coupling the at least one electrically conductive plate to the sheet insulator.

18. The method of claim 15, wherein coupling the at least one electrically conductive plate to a power source comprises:

coupling each of two substantially solid electrically conductive plates to a different power source, wherein the two electrically conductive plates are electrically isolated from one another.

19. The method of claim 15, wherein the measured voltage is determined by:

placing a voltage sense point on the at least one electrically conductive plate at a location corresponding to about half the voltage drop across the at least one electrically conductive plate.

20. The method of claim 15, further comprising:

coupling a power return plate to the one or more cards.

* * * * *